US011205483B2

(12) United States Patent
Lee et al.

(10) Patent No.: US 11,205,483 B2
(45) Date of Patent: *Dec. 21, 2021

(54) MEMORY SYSTEM HAVING DIES AND OPERATING METHOD OF THE MEMORY SYSTEM OUTPUTTING A COMMAND IN RESPONSE TO A STATUS OF A SELECTED DIE

(71) Applicant: SK hynix Inc., Icheon-si (KR)

(72) Inventors: Hee Youl Lee, Icheon-si (KR); Ji Ho Park, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/678,778

(22) Filed: Nov. 8, 2019

(65) Prior Publication Data

US 2020/0075103 A1 Mar. 5, 2020

Related U.S. Application Data

(63) Continuation-in-part of application No. 16/159,287, filed on Oct. 12, 2018, now Pat. No. 10,503,439,
(Continued)

(30) Foreign Application Priority Data

Apr. 11, 2016 (KR) ........................ 10-2016-0044281

(51) Int. Cl.
*G11C 16/10* (2006.01)
*G11C 16/16* (2006.01)
(Continued)

(52) U.S. Cl.
CPC ............ *G11C 16/10* (2013.01); *G06F 3/0614* (2013.01); *G06F 3/0659* (2013.01);
(Continued)

(58) Field of Classification Search
CPC ...... G06F 3/0604; G06F 3/0614; G06F 3/064; G06F 3/0652; G06F 3/0659; G06F 3/0679; G11C 16/0483; G11C 16/10; G11C 16/16
(Continued)

(56) References Cited

U.S. PATENT DOCUMENTS 6,490,198 B2 * 12/2002 Yoshimura ............. G11C 29/50
365/185.02
6,597,609 B2 7/2003 Chevallier
(Continued)

FOREIGN PATENT DOCUMENTS

CN 101414282 A 4/2009
CN 102592668 A 7/2012
(Continued)

OTHER PUBLICATIONS

Y. Hu et al. "Performance impact and interplay of SSD parallelism through advanced commands, allocation strategy and data granularity". In Proceedings of the international conference on Supercomputing (ICS '11). Association for Computing Machinery, New York, NY, USA, 96-107. (Year: 2011).*

(Continued)

*Primary Examiner* — Reginald G Bragdon
*Assistant Examiner* — Aaron D Ho
(74) *Attorney, Agent, or Firm* — William Park & Associates Ltd.

(57) ABSTRACT

A memory system includes: a plurality of dies including a plurality of memory blocks; and a memory controller for outputting a normal program command when a die including a selected memory block is a normal die having an electrical characteristic higher than or equal to a reference value in a program operation, and outputting a partial program command and a partial erase command when the die including
(Continued)

the selected memory block is a low status die having an electrical characteristic lower than the reference value.

3 Claims, 16 Drawing Sheets

Related U.S. Application Data which is a continuation of application No. 16/031,147, filed on Jul. 10, 2018, now Pat. No. 10,127,986, which is a continuation of application No. 15/264,764, filed on Sep. 14, 2016, now Pat. No. 10,049,746.

(51) Int. Cl.
*G06F 3/06* (2006.01)
*G11C 16/04* (2006.01)

(52) U.S. Cl.
CPC ........ *G06F 3/0679* (2013.01); *G11C 16/0483* (2013.01); *G11C 16/16* (2013.01)

(58) Field of Classification Search
USPC ........................................................ 711/154
See application file for complete search history.

(56) References Cited

U.S. PATENT DOCUMENTS

| | | |
|---|---|---|
| 7,804,718 B2 | 9/2010 | Kim |
| 7,965,554 B2 | 6/2011 | Lutze et al. |
| 8,014,209 B2 | 9/2011 | Lutze et al. |
| 8,144,511 B2 | 3/2012 | Dong et al. |
| 9,639,282 B2 * | 5/2017 | Kankani ................ G06F 3/0638 |
| 2010/0174847 A1 * | 7/2010 | Paley .................. G06F 12/0246 711/103 |
| 2014/0089729 A1 * | 3/2014 | Sonoda ................. G06F 11/108 714/6.21 |
| 2014/0269053 A1 | 9/2014 | Chen et al. |
| 2014/0321202 A1 * | 10/2014 | Yang .................. G11C 16/3495 365/185.03 |
| 2016/0004615 A1 * | 1/2016 | Uehara ................. G06F 3/0619 714/6.22 |
| 2016/0217860 A1 | 7/2016 | Lai et al. |
| 2016/0259675 A1 * | 9/2016 | Ninose .................... G11C 29/76 |
| 2019/0066818 A1 * | 2/2019 | Lee ....................... G11C 29/025 |
| 2019/0122741 A1 * | 4/2019 | Cheng ................ G11C 16/3495 |
| 2020/0104201 A1 * | 4/2020 | Kang ................... G06F 11/0793 |
| 2020/0194092 A1 * | 6/2020 | Thiruvengadam ..... G11C 29/38 |

FOREIGN PATENT DOCUMENTS

| | | |
|---|---|---|
| CN | 102763166 A | 10/2012 |
| CN | 104025197 A | 9/2014 |
| CN | 107112047 A | 8/2017 |
| KR | 1020110032795 A | 3/2011 |
| KR | 1020120079202 A | 7/2012 |

OTHER PUBLICATIONS

"Some—Definition of Some by Merriam-Webster", retrieved Mar. 19, 2016 via the WayBack Machine, (Year: 2016).

* cited by examiner

MEMORY SYSTEM HAVING DIES AND OPERATING METHOD OF THE MEMORY SYSTEM OUTPUTTING A COMMAND IN RESPONSE TO A STATUS OF A SELECTED DIE

CROSS-REFERENCE TO RELATED APPLICATION

The present application is a Continuation in Part of U.S. patent application Ser. No. 16/159,287 filed on Oct. 12, 2018, which is a continuation application for U.S. patent application Ser. No. 16/031,147 filed on Jul. 10, 2018, which is a continuation application for U.S. patent application Ser. No. 15/264,764 filed on Sep. 14, 2016, and claims priority under 35 U.S.C § 119(a) to Korean patent application number 10-2016-0044281 filed on Apr. 11, 2016, in the Korean Intellectual Property Office, the entire disclosure of which is incorporated herein by reference.

BACKGROUND

1. Technical Field

An aspect of the present disclosure generally relates to a memory system device and an operating method thereof, and more particularly to a program method of a three-dimensional memory device.

2. Related Art

A memory device may have memory cells capable of storing data. The memory cells may be grouped into a plurality of memory blocks. The memory device may have peripheral circuits for performing various operations such as a program operation on a selected memory block, and may also have a control logic for controlling the peripheral circuits.

Memory devices may be classified into two categories, two-dimensional and three-dimensional memory devices, depending on how the memory cells included in a memory block are arranged. For example, in a two-dimensional memory device, memory cells may be arranged horizontally with respect to a substrate, and in a three-dimensional memory device, memory cells may be arranged vertically with respect to a substrate.

In the three-dimensional memory device, memory cells may be stacked in the vertical direction on a substrate to improve integration density. A non-volatile memory device may retain its data even in the absence of a power source. Thus, the non-volatile memory device is widely used as a data storage device for portable electronic devices.

SUMMARY

Embodiments provide a memory system and an operating method thereof, which can improve the reliability of a program operation of the memory device.

According to an aspect of the present disclosure, there is provided a memory system including: a plurality of dies including a plurality of memory blocks; and a memory controller configured to output a normal program command when a die including a selected memory block is a normal die having an electrical characteristic higher than or equal to a reference value in a program operation, and output a partial program command and a partial erase command when the die including the selected memory block is a low status die having an electrical characteristic lower than the reference value.

According to another aspect of the present disclosure, there is provided a method for operating a memory system, the method including: storing, in a low status die table, die addresses of dies corresponding to a status lower than a reference value by testing electrical characteristics of dies; determining whether a die address of a die including a selected memory block is stored in the low status die table in a program operation; and outputting a partial program command for sequentially programming pages up to a set page of the selected memory block and a partial erase command for erasing pages in an erase state, when the die address of the die including the selected memory block is included in the low status die table.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
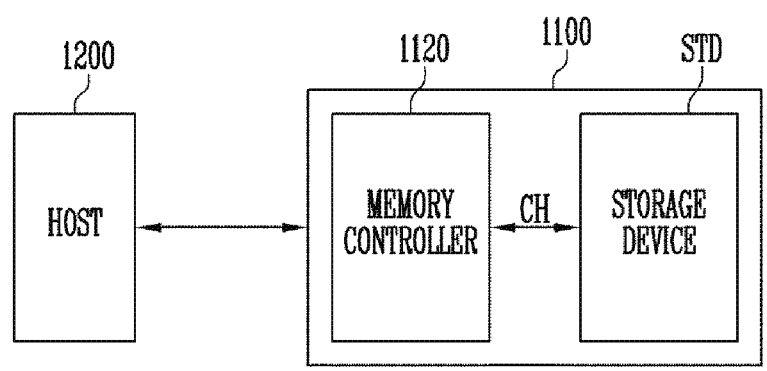
FIG. 1 is a diagram illustrating an example of a memory system according to an embodiment of the present disclosure.

FIG. 1 is a diagram illustrating an example of a memory system according to an embodiment of the present disclosure.

Referring to FIG. 1, the memory system 1000 may include a storage device STD for storing data therein and a memory controller 1120 for controlling the storage device.

The memory system 1100 may operates a program, read or erase operation according to a request output from a host 1200.

The host 1200 may communicate with the storage device 1100 by using an interface protocol such as peripheral component interconnect-express (PCI-E), advanced technology attachment (ATA), serial ATA (SATA), parallel ATA (PATA), or serial attached SCSI (SAS). In addition, interface protocols between the host 1200 and the memory system 1100 are not limited to the above-described examples, and may be one of other interface protocols such as a universal serial bus (USB), a multi-media card (MMC), an enhanced small disk interface (ESDI), and integrated drive electronics (IDE).

The memory controller 1120 may control operations of the storage device 1100, and may control data exchange between the host 1200 and the storage device STD. For example, the memory controller 1120 may control the storage device STD to perform a program, read, or erase operation in response to a request of the host 1200. In this embodiment, the memory controller 1120 may receive information on a structure and an operating method of memory blocks from the storage device STD, and selectively generate and output a command for controlling the storage device STD, based on the received information. For example, the memory controller 1120 may output a normal program command or partial program command and a partial erase command, based on status information of a die included in a selected memory block in a program operation.

Figure 2:
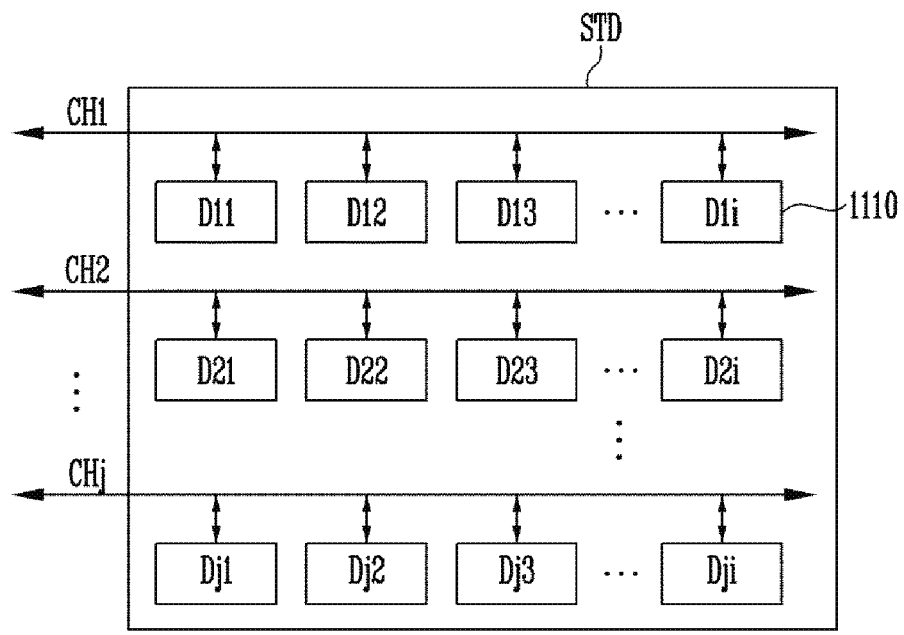
FIG. 2 is a diagram illustrating a storage device of FIG. 1.

FIG. 2 is a diagram illustrating a storage device of FIG. 1.

Referring to FIG. 2, the storage device STD may include a plurality of dies D11 to Dji. Each of the dies D11 to Dji may be a memory device 1110 for storing data. The dies D11 to Dji may communicate with the memory controller 1120 through channels CH1 to CHj. For example, eleventh to 1ith dies D11 to D1*i* may be coupled to a first channel CH1, twenty-first to 2ith dies D21 to D2*i* may be coupled to a second channel CH2, and j1th to jith dies Dj1 to Dji may be coupled to a jth channel CHj.

Although the plurality of dies D11 to Dji are configured identical to one another, electrical characteristics of the plurality of dies D11 to Dji may be different from one another due to characteristics of a manufacturing process. Ideally, the plurality of dies D11 to Dji are to have the same electrical characteristic, but may have different electrical characteristics due to a limit of the manufacturing process.

Figure 3:
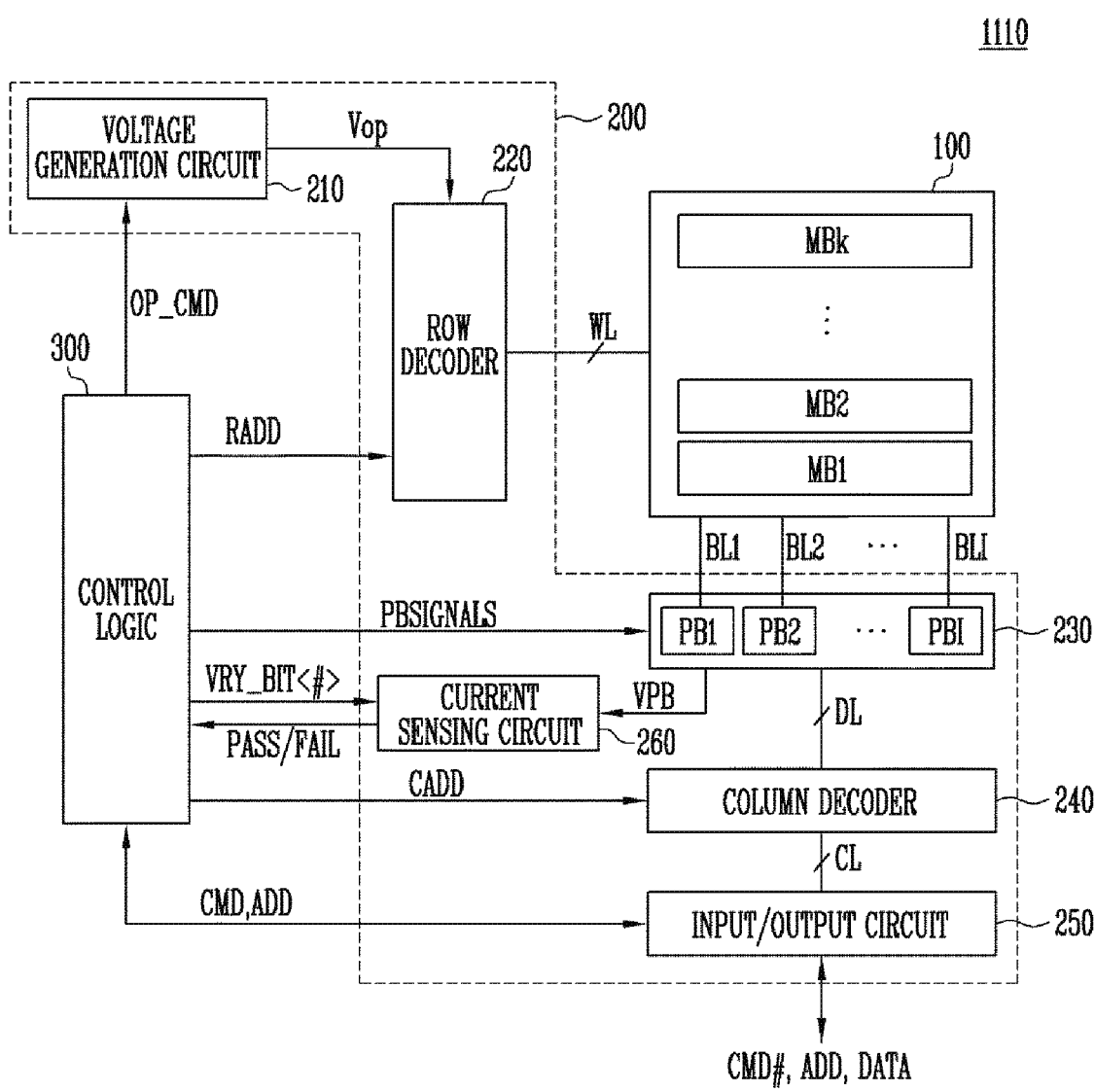
FIG. 3 is a diagram illustrating in detail a memory device of FIG. 2.

FIG. 3 is a diagram illustrating in detail a memory device of FIG. 2.

Referring to FIG. 3, the memory device 1110 may include a memory cell array 100 for storing data. The memory device 1110 may include peripheral circuits 200 that perform a program operation for storing data in the memory cell array 100, a read operation for outputting the stored data, and an erase operation for erasing the stored data. The memory device 1110 may include a control logic 300 for controlling the peripheral circuits 200 under control of the memory controller (1120 of FIG. 1).

The memory cell array 100 may be divided into a plurality of memory blocks MB1 to MBk (k is a positive integer). Word lines WL and bit lines BL1 to BLI (I is a positive integer) may be coupled to the memory blocks MB1 to MBk. The word lines WL may be coupled to the respective memory blocks, and the bit lines BL1 to BLI may be coupled in common to the memory blocks MB1 to MBk. The memory blocks MB1 to MBk may be implemented in a two-dimensional or three-dimensional structure. When the memory blocks MB1 to MBk are implemented in a three-dimensional structure, source select lines, drain select lines, and a source line may be coupled to each of the memory blocks MB1 to MBk, in addition to the word lines WL. Pipe lines may be additionally coupled to each of the memory blocks MB1 to MBk. For example, the memory blocks MB1 to MBk may be divided into user blocks or meta blocks according to the use thereof.

Data used by a user may be stored in the user blocks, and system data used in the storage group STG may be stored in the meta blocks. Address mapping information and structure type information of the memory blocks may be included in the system data, and operating method information of the memory blocks may also be included in the system data. Therefore, most of the memory blocks MB1 to MBk included in the memory cell array 100 may be used as the user blocks, and only some memory blocks may be used as the meta blocks.

The peripheral circuits 200 may program memory cells, and may erase data from memory cells under control of the control logic 300. In a program operation, the peripheral circuits 200 may sequentially program memory cells of selected pages. In an embodiment, if a previously set page is selected, the peripheral circuits 200 may perform a partial erase operation. For example, if the set page is selected, the peripheral circuits 200 may perform a partial erase operation on all or some of non-programmed pages, and then perform the program operation on the pages on which the partial erase operation has been performed. To this end, the peripheral circuits 200 may include a voltage generation circuit 210, a row decoder 220, a page buffer unit 230, a column decoder 240, an input/output circuit 250, and a current sensing circuit 260.

Each circuit may operate as follows.

The voltage generation circuit 210 may generate various operating voltages Vop that will be used in a program, read, or erase operation in response to an operation signal OP_CMD. For example, the voltage generation circuit 210 may generate a program voltage, a read voltage, a pass voltage, a turn-on voltage, and the like.

The row decoder 220 may apply the operating voltages Vop to a word line WL coupled to a selected memory block in response to a row address RADD. Although not illustrated in FIG. 2, the row decoder 220 may apply the operating voltages Vop to source select lines, drain select lines, a source line, or pipe lines in response to the row address RADD.

The page buffer unit 230 may include a plurality of page buffers PB1 to PBI respectively coupled to the bit lines BL1 to BLI. The page buffers PB1 to PBI may operate in response to page buffer control signals PBSIGNALS. For example, the page buffers PB1 to PBI may temporarily store data received through the bit lines BL1 to BLI, or may sense voltages or currents of the bit lines BL1 to BLI in a read or verify operation. The verify operation may include a verify operation performed in the program and erase operations.

The column decoder 240 may transmit data between the input/output circuit 250 and the page buffer unit 230 in response to a column address CADD. For example, the column decoder 240 may transmit/receive data to/from the page buffers PB through data lines DL, or may transmit/receive data to/from the input/output circuit 250 through column lines CL.

The input/output circuit 250 may transmit, to the control logic 300, a command CMD # and an address ADD, which are transmitted from the memory controller (1120 of FIG. 1), or may transmit/receive data DATA to/from the column decoder 240.

In a read or verify operation, the current sensing circuit 260 may generate a reference current in response to a permission bit VRY_BIT<#> and compare the reference current with a sensing voltage VPB received from the page buffer unit 230, thereby outputting a "pass" signal PASS or a "fail" signal FAIL.

The control logic 300 may control the peripheral circuits 200 by outputting the operation signal OP_CMD, the row address RADD, the page buffer control signals PBSIGNALS, and the permission bit VRY_BIT<#> in response to the command CMD # and the address ADD. Also, in response to the pass or fail signal PASS or FAIL, the control logic 300 may determine whether a certain memory cell has passed or failed a verification process. In a program operation, the control logic 300 may select one or more pages according to the command CMD # and the address ADD and control the peripheral circuits 200 to perform the program operation on the selected pages. In an embodiment, a certain page may be set for a partial erase operation. If any one of the previously set pages is selected, a partial erase operation may be performed on all or some of pages in an erase state, and then the program operation may be performed. In this case, the address of the selected page may be compared with the address of the set page in response to the command CMD # to determine whether to perform the partial erase operation before performing the program operation.

The control logic 300 according to this embodiment may perform different program operations depending on kinds of the command CMD # for the program operation. For example, when the command CMD # is a normal program command, the control logic 300 may perform a normal program operation. When a partial program command and a partial erase command are received, the control logic 300 may perform a partial program operation and a partial erase operation.

The normal program operation may be performed in a manner that newly selects a next word line when memory cells of a selected page are programmed by applying a program voltage to a selected word line, and applies a program voltage to the newly selected word line.

The partial program operation and the partial erase operation may be repeatedly performed until the partial erase operation is performed on unselected pages when the partial program operation is performed on pages up to a set page, and a program operation of all selected pages is completed.

The partial program operation and the partial erase operation will be described in detail later.

Figure 4:
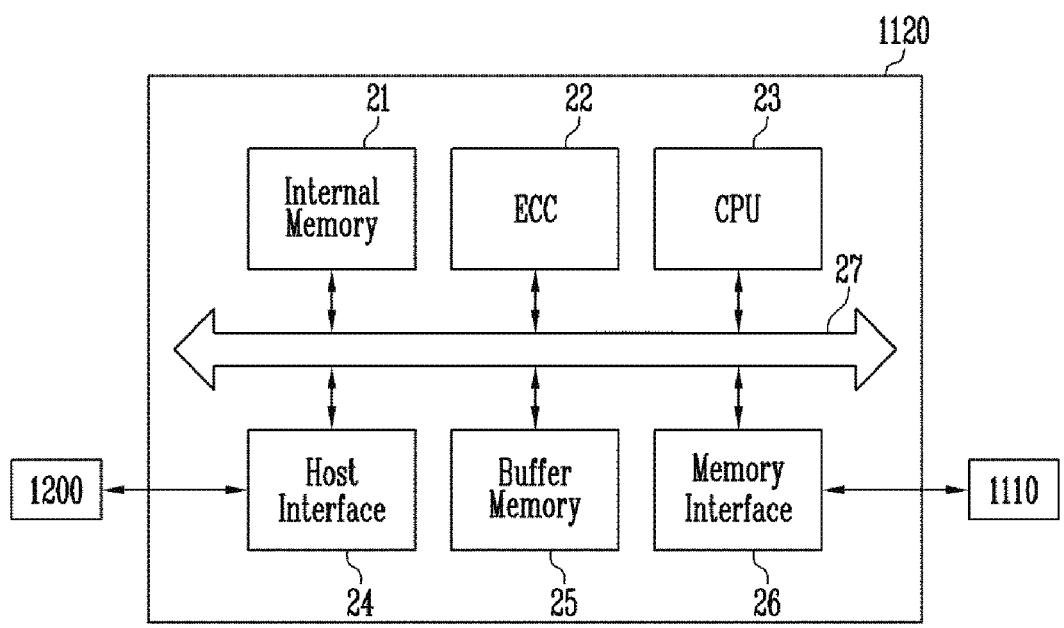
FIG. 4 is a diagram illustrating a controller of FIG. 1.

FIG. 4 is a diagram illustrating a controller of FIG. 1.

Referring to FIG. 4, the memory controller 1120 may include an internal memory 21, an error correction circuit (ECC) 22, a central processing unit (CPU) 23, a host interface 24, a buffer memory 25, and a memory interface 26 so as to communicate between the host 1200 and the memory device 1110. The internal memory 21, the ECC 22, the CPU 23, the host interface, the buffer memory 25, and the memory interface 26 may communicate with each other through a bus 27.

The internal memory 21 may store various system information required to operate the storage device 1100 memory system 1000. For example, the internal memory 21 may store address information and the like, which are required to operate the storage device 1100 memory system 1000. The internal memory 21 may be implemented with a DRAM, an SRAM, a PRAM, etc. The internal memory 21 may include a free block table and a low status die table. Addresses of free blocks that may be selected in a program operation may be stored in the free block table. Addresses of dies in which electrical characteristics of memory devices are lower than a reference value characteristic may be stored in the low status die table. The addresses stored in the free block table and the low status die table may be frequently updated according to a state of the memory devices.

The ECC 22 may detect an error from data read in a read operation, and correct the detected error.

The memory type manager 22 may store a table about type information of the memory device 1110. When an external request is received from the host 1200, the memory type manager 22 may generate an internal request, using a code corresponding to information received from the memory device 1110.

The CPU 23 may perform various calculations for controlling the memory device 1110, or generate various commands. For example, when a request for controlling the memory device 1110 is received, the CPU 23 may generate a command in response to the received request. Also, the CPU 23 may generate an internal operation command for managing the memory device 1110 even when any request is not received from the host 1200.

Also, the CPU 23 may compare tables stored in the internal memory 21 with each other in response to a received command, and transmit addresses to the memory device 1110, based on the comparison result.

Also, when garbage collection is performed, the CPU 23 may output a command such that frequently read hot data is moved to a normal die and cold data having a low use frequency is moved to a low status die.

The host interface 24 may exchange a command, an address, and data between the memory controller 1120 and the host 1200. The host interface 24 may communicate with the host 1200 by using a protocol such as a Peripheral Component Interconnect express (PCIe), an Advanced Technology Attachment (ATA), a Serial ATA (SATA), a Parallel ATA (PATA), a Serial Attached SCSI (SAS) or Non-Volatile Memory express (NVMe). The protocol between the host interface 24 and the host 1200 is not limited to the above-described examples, and may include various interfaces such as a Universal Serial Bus (USB), a Multi-Media Card (MMC), an Enhanced Small Disk Interface (ESDI), and an Integrated Drive Electronics (IDE).

The buffer memory 25 may be used as a working memory or cache memory of the memory controller 1120, and store system data used in the storage group STG. For example, the buffer memory 25 may include a Double Data Rate Synchronous Dynamic Random Access Memory (DDR SDRAM), a DDR4 SDRAM, a Low Power Double Data Rate 4 (LPDDR4) SDRAM, a Low Power DDR (LPDDR), and a Rambus Dynamic Random Access Memory (RDRAM). Although FIG. 2 illustrates that the buffer memory 25 is included in the memory controller 1120, the memory buffer 25 may be separately mounted at the outside of the memory controller 1120.

The memory interface 26 may exchange a command, an address, data, and the like between the memory controller 1120 and the memory device 1110. For example, the memory interface 26 may transmit a command, an address, data, and the like to the memory device 1110 through a channel, and receive data and the like from the memory device 1110.

Figure 5:
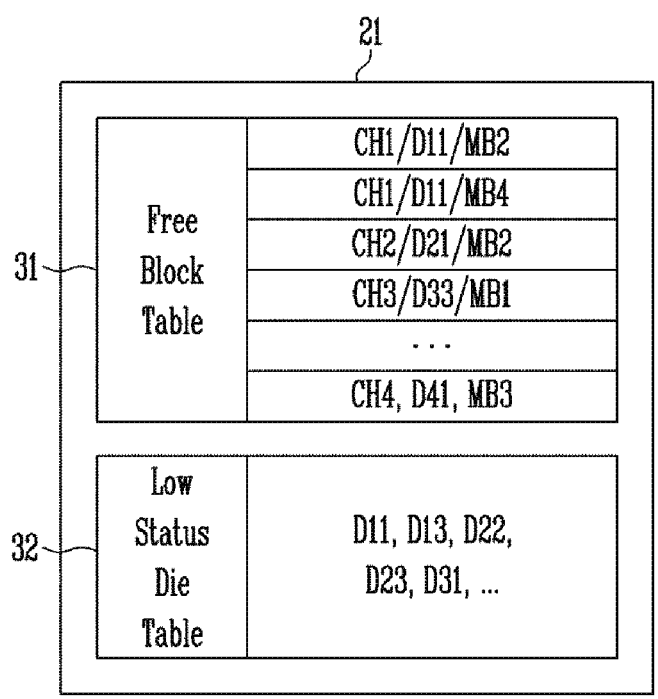
FIG. 5 is a diagram illustrating tables stored in an internal memory.

FIG. 5 is a diagram illustrating tables stored in the internal memory.

Referring to FIG. 5, a free block table 31 may store addresses of free blocks selectable for a program operation among a plurality of memory blocks included in a storage device. For example, an address may include a channel address, a die address, and a memory block address. CH1/D11/MB2 as a first address shown in FIG. 5 means a second memory block MB2 of the eleventh die D11 coupled to the first channel CH1. The addresses stored in the free block table 31 may be frequently updated since memory blocks in a free state are frequently changed.

A low status die table 32 may store addresses of dies corresponding to memory devices of which electrical characteristics are lower than a reference value. For example, when a test phase is performed to detect a failure of memory devices, there may exist dies that can be normally used but are in a status lower than a test reference. Various test operations such as a program, read, and erase operations may be performed in the test phase, and a test method may vary depending on storage devices.

A test operation may be performed in a manufacturing phase, or be frequently performed through a background operation while the memory system is being used. When the test operation is performed only once in the manufacturing phase, the addresses stored in the low status die table 32 may be maintained as fixed information. When the test operation is frequently performed during an operation of the memory system, the addresses stored in the low status die table 32 may be varied. For example, since electrical characteristics of dies are degraded as various operations are performed, a number of the addresses stored in the low status die table 32 may be gradually increased.

When the number of the address stored in the low status die table 32 is greater than a reference number, the CPU may output a signal notifying the host that the state of the storage device is degraded.

Figure 6:
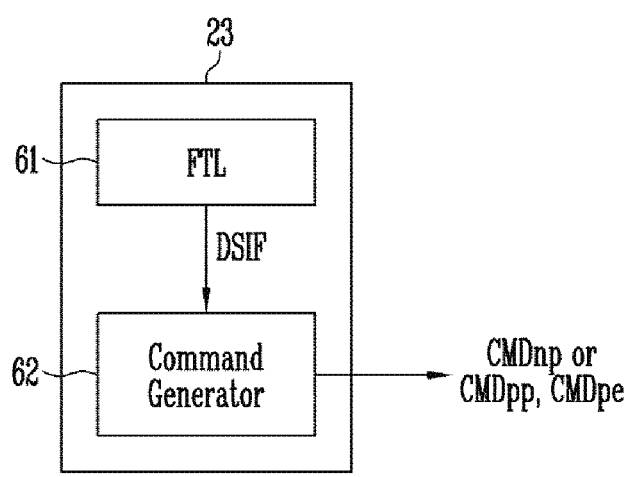
FIG. 6 is a diagram illustrating a Central Processing Unit.

FIG. 6 is a diagram illustrating a central processing unit.

Referring to FIG. 6, the central processing unit 23 may include a flash translation layer (FTL) 61 and a command generator 62.

When a program command is received, the FTL 61 may select an address of a free block stored in the free block table (31 shown in FIG. 5) according to a capacity of data to be stored, compare the selected address with an address stored in the low status die table (32 shown in FIG. 5), and output die status information DSIF, based on the comparison result. For example, the FTL 61 may output the die status information DSIF including information on whether a selected die address included in the selected address in the free block table (31 shown in FIG. 5) is included in a die address included in the low status die table (32 shown in FIG. 5).

The command generator 62 may output a normal program command CMDnp or output a partial program command CMDpp and a partial erase command CMDpe according to the die status information DSIF. When the partial program command CMDpp and the partial erase command CMDpe are output, the command generator 62 may frequently output the partial program command CMDpp and the partial erase command CMDpe, until a program operation of the selected memory block is completed. In other words, when an electrical characteristic of a die is degraded, electrical characteristics of memory blocks included in the corresponding die may be degraded, and therefore, a threshold voltage distribution of memory cells may be unintentionally changed. Accordingly, in this embodiment, the partial program operation and the partial erase operation are performed in a die of which electrical characteristic is degraded, so that a threshold voltage distribution of memory cells can be formed narrow.

Figure 7:
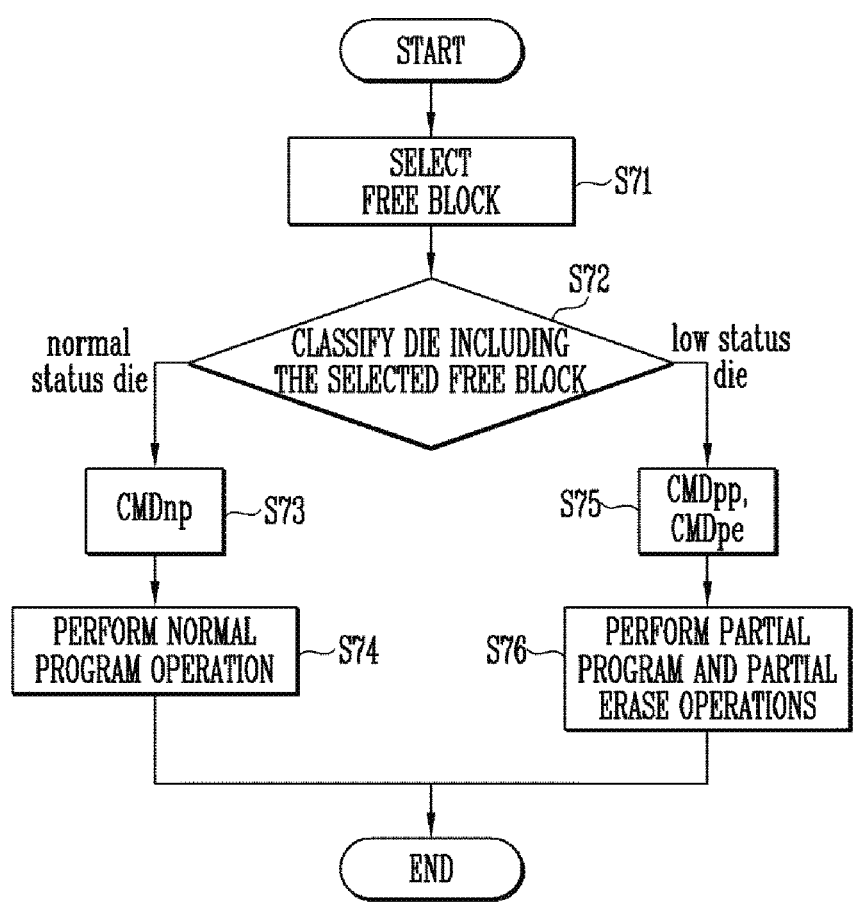
FIG. 7 is a diagram illustrating a program operation according to an embodiment of the present disclosure.

FIG. 7 is a diagram illustrating a program operation according to an embodiment of the present disclosure.

Referring to FIG. 7, when the host outputs a program request, the memory controller may select a free block from the free block table (S71).

Subsequently, the memory controller sorts a die including the selected memory block (S72). For example, when it is determined whether an address of the die including the selected memory block is not stored in the low status die table, the memory controller may determine the selected die as a normal status die. When it is determined whether the address of the die including the selected memory block is stored in the low status die table, the memory controller may determine the selected die as a low status die.

When the selected die is determined as the normal status die, the memory controller may output a normal program command CMDnp (S73), and the selected die may perform a normal program operation in response to the normal program command CMDnp (S74).

When the selected die is determined as the low status die, the memory controller may output a partial program command CMDpp and a partial erase command CMDpe (S75). The selected die may perform a partial program operation in response to the partial program command CMDpp, and perform a partial erase operation in response to the partial erase command CMDpe (S76).

Figure 8:
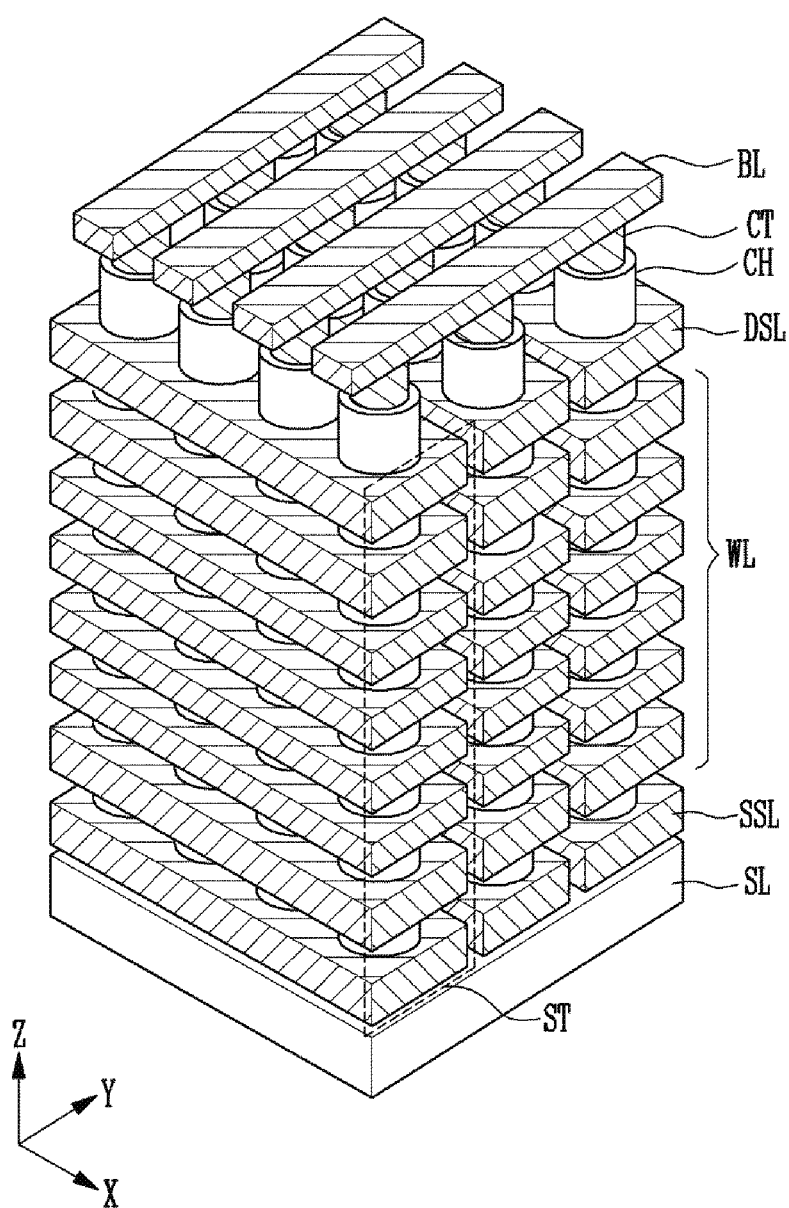
FIG. 8 is a perspective view illustrating an example of a memory block implemented in a three-dimensional structure.

FIG. 8 is a perspective view illustrating an example of a memory block implemented in a three-dimensional structure.

Referring to FIG. 8, the memory block implemented in the three-dimensional structure. For example, a memory block with I-shaped cell strings may be formed in a Z direction over a substrate, and may include cell strings ST arranged between bit lines BL and a source line SL. Example of the I-shaped structure may include "bit cost scalable (BiCS)" or "I-shape" structure. For example, if the source line SL is horizontally formed over the substrate, the strings ST (e.g., the strings ST having the BiCS structure) may be formed in the vertical direction (e.g., Z direction) over the source line SL. More specifically, the strings ST may include source select lines SSL, word lines WL, and drain select lines DSL, which are arranged in a first direction (e.g., Y direction) and spaced apart from each other. The number of source select lines SSL, word lines WL, and drain select lines DSL is not limited to the number shown in FIG. 8, and may vary depending on memory devices. The strings ST may include vertical channel layers CH vertically penetrating the source select lines SSL, the word lines WL, and the drain select lines DSL, and the bit lines BL contacting the tops of the vertical channel layers CH protruding upwardly from the drain select lines DSL. The bit lines BL may be arranged in a second direction (e.g., X direction) perpendicular to the first direction (e.g., Y direction). Memory cells may be formed between the word lines WL and the vertical channel layers CH. Contact plugs CT may be further formed between the bit lines BL and the vertical channel layers CH. Memory cells coupled to the same word line may be referred to as a page. A program operation may be performed on a page basis, and a partial erase operation may be performed in one or more pages.

A program operation of the three-dimensional memory device described in FIG. 8 will be described as follows.

Figure 9:
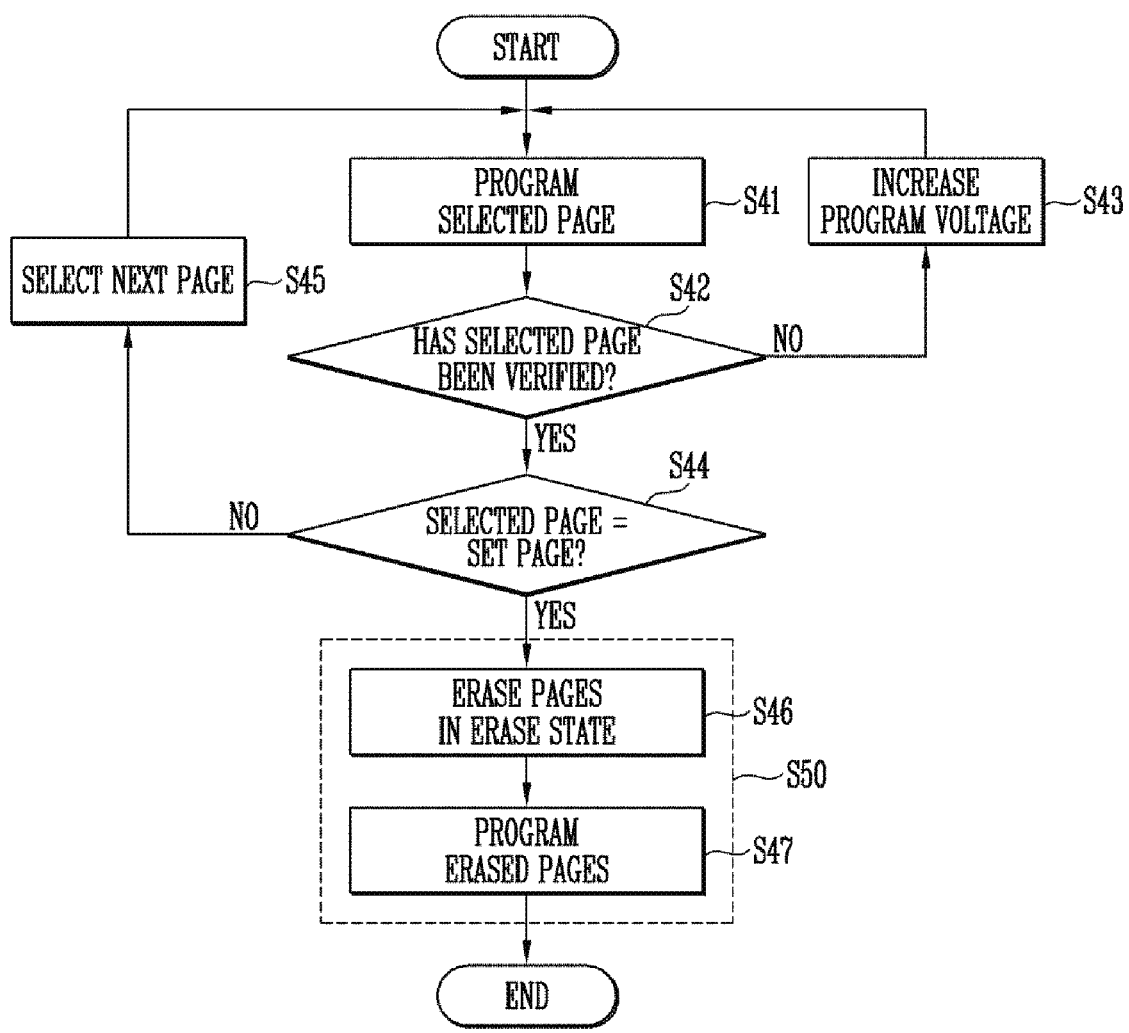
FIG. 9 is a flowchart illustrating an example of a program operation according to an embodiment of the present disclosure.

FIG. 9 is a flowchart illustrating an example of a program operation according to an embodiment of the present disclosure.

Referring to FIG. 9, the program operation may be performed using an incremental step pulse program (ISPP) method in which a program voltage is gradually increased. If the program operation is started, the program operation of a selected page may be performed according to a row address (S41). The program operation of the selected page may be performed by applying a program voltage to a selected word line coupled to the selected page.

After the program voltage is applied to the selected word line for a predetermined time, a verify operation of the selected page is performed (S42). The verify operation of the selected page may be performed by applying a verify voltage to the selected word line. The step S41 of applying the program voltage to the selected word line and the step 42 of applying the verify voltage to the selected word line may constitute a program loop. In the program operation using the ISPP method, as the number of program loops increases, the program voltage is gradually increased. If any memory cell of the selected page has failed the verification process, the program voltage is increased (S43), and the steps 'S41' to 'S43' are repeated.

If the selected page has passed the verification process, it is determined whether the selected page is a set page (S44). The set page may be one of the pages vulnerable to disturbance. For example, the set page may be set to a page in which a program disturbance starts increasing, among pages vulnerable to disturbance. The selected page and the set page may be determined based on their addresses.

The address of the set page may be set during a test program operation of the memory device, and the address of the selected page may be stored in a storage unit of the memory device. For example, in the test program operation, the address of a page in which the program disturbance starts increasing, among a plurality of pages, may be stored as the address of the set page.

If the address of the selected page is not identical to the address of the set page at the step of comparing the address of the selected page with the address of the set page (S44), a next page is selected for the program operation. Accordingly, the next page becomes the selected page, and the program operation may be sequentially performed on the selected page by repeating the steps discussed above S41 to S45.

If the address of the selected page is identical to the address of the set page (S44), a disturbance compensation operation (S50) may be performed.

The disturbance compensation operation (S50) may be performed on non-programmed pages. For example, the disturbance compensation operation S50 may include a partial ease operation (S46) of all or some of pages in an erase state and a program operation (S47) of the partially erased pages.

The partial erase operation (S46) may be selectively performed on the non-programmed pages. By performing an erase operation on the non-programmed pages before performing a program operation, a distribution of threshold voltages of memory cells of non-programmed pages may be initialized. That is, when the program operation is performed, a pass voltage is applied to word lines coupled to unselected memory cells. In this case, if the unselected memory cells are continuously influenced by the pass voltage, threshold voltages of the unselected memory cells may be changed. For example, if a program disturbance occurs, threshold voltages of the non-programmed memory cells (memory cells in the erase state) may be unintentionally increased. In the program operation, when program operations are performed on a plurality of memory cells in a selected page, and when some of the memory cells in the selected page are supposed to stay in the erase state, if such memory cells are influenced by the program disturbance, their threshold voltages may be increased, and therefore, errors may occur in a read operation. Particularly, due to characteristics of the three-dimensional memory device, a channel area becomes narrower as it comes closer to a lower portion of a string. Hence, memory cells located at the lower portion of the string may be further influenced by the program disturbance, as compared with those located at the upper portion of the string.

In an embodiment, the numbers of the word lines WL may begin at the lower portion of the string, and word line numbers may increase toward a top of the page. In addition, the program operations may be performed in a descending order. In this scenario, the lower the number of the word line number, the more the disturbance. In an embodiment, the partial erase operation may be performed on the memory cells coupled to the low-numbered word lines, so that it is possible to prevent errors from occurring at such memory cells vulnerable to disturbance. The partial erase operation may be performed using an incremental step pulse erase (ISPE) method in which an erase voltage is gradually increased, or may be performed using a method in which only an erase voltage is used without performing an erase verify operation.

If the partial erase operation of all or some of the pages in the erase state is completed (S50), the program operation of the partially erased pages is performed (S47).

In an embodiment, if the program operation is completed up to the set page, the partial erase operation may be performed on the other pages. However, a page on which the partial erase operation is to be performed may be set as the set page. In this case, if the program operation is scheduled to be performed on the set page, the partial erase operation may be performed. As described above, the set page may be determined depending on characteristics of memory devices.

Hereinafter, a program method will be described. According to the program method, after the program operation is performed up to the set page, the partial erase operation is performed.

Figure 10:
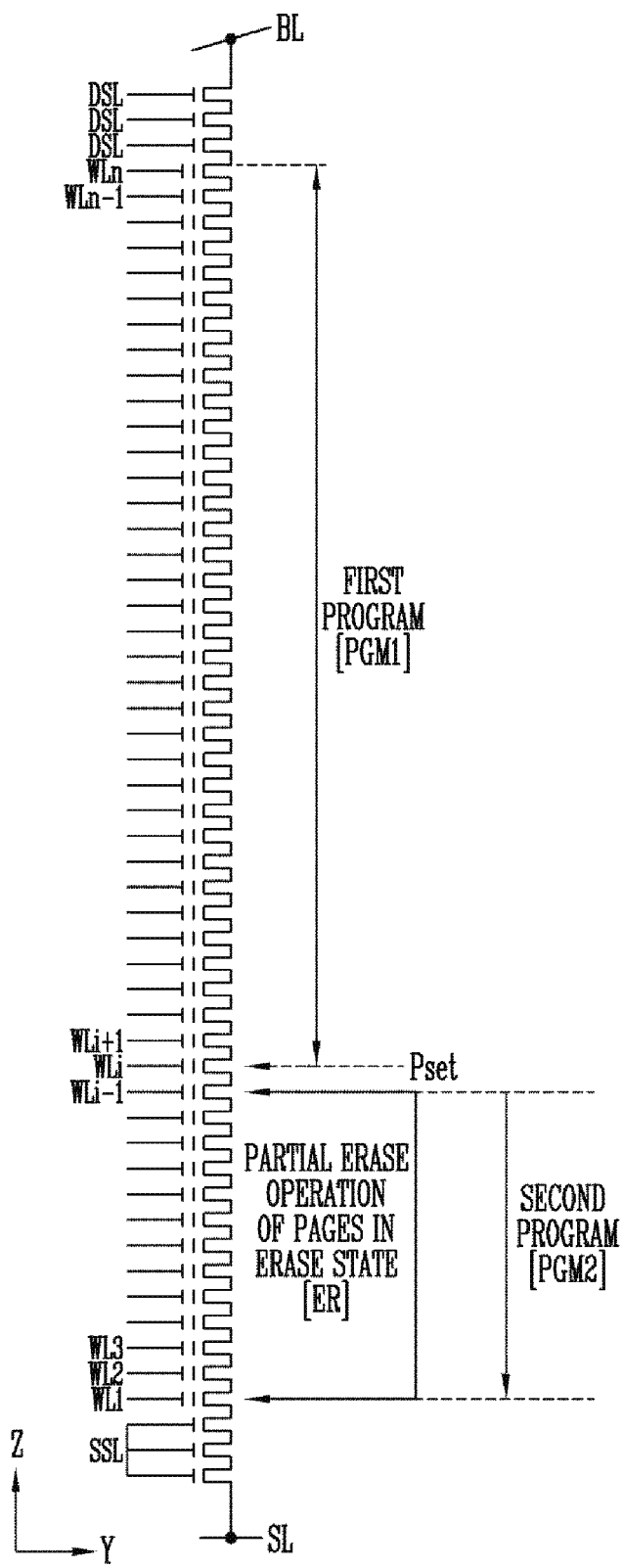
FIG. 10 is a diagram illustrating in detail the program operation according to an embodiment of the present disclosure.

FIG. 10 is a diagram illustrating in detail the program operation according to an embodiment of the present disclosure. Here, the program operation of the I-shaped string illustrated in FIG. 3 will be discussed.

Referring to FIG. 10, it is assumed that a word line adjacent to source select lines SSL is a first word line WL1 and a word line adjacent to drain select lines DSL is an nth word line WLn (n is a positive integer). The program operation may be sequentially performed in an order from an nth page coupled to the nth word line WLn to a first page coupled to the first word line WL1. Here, the nth word line WLn may be a word line located at the uppermost end among the word lines of FIG. 8, and the first word line WL1 may be a word line located at the lowermost end among the word lines of FIG. 8.

In a test program operation of the memory device, when it is determined that a program disturbance frequently occurs in first to (i−n)th pages respectively coupled to first to (i−1)th word lines WL1 to WLi−1 (i is a positive integer, and i<n), an ith page coupled to an ith word line WLi adjacent to an upper portion of the (i−1)th word line WLi−1may be a set page Pset. Therefore, the program operation may be sequentially performed in an order from the nth page coupled to the nth word line WLn to the ith page coupled to the ith word line WLi. It is assumed that the program operation performed on the nth to ith pages is a first program operation PGM1.

If the first program operation PGM1 is completed, a partial erase operation may be performed on all or some of non-programmed pages (pages in an erase state). For example, a partial erase operation ER may be performed on the (i−1)th to first pages respectively coupled to the (i−1)th to first word lines WLi−1to WL1. Here, the (i−1)th to first pages may be non-programmed pages.

If the partial erase operation ER of the (i−1)th to first pages is completed, the program operation may be sequentially performed on the partially erased (i−1)th to first pages. It is assumed that the program operation performed on the (i−1)th to first pages is a second program operation PGM2.

That is, if the program operation is started, the first program operation PGM is performed on some pages, and, if the first program operation PGM1 is completed up to the set page Pset, the partial erase operation ER is performed on all or some of the other pages. Subsequently, the second program operation PGM2 is performed on the other pages on which the partial erase operation ER has been performed.

Figure 11:
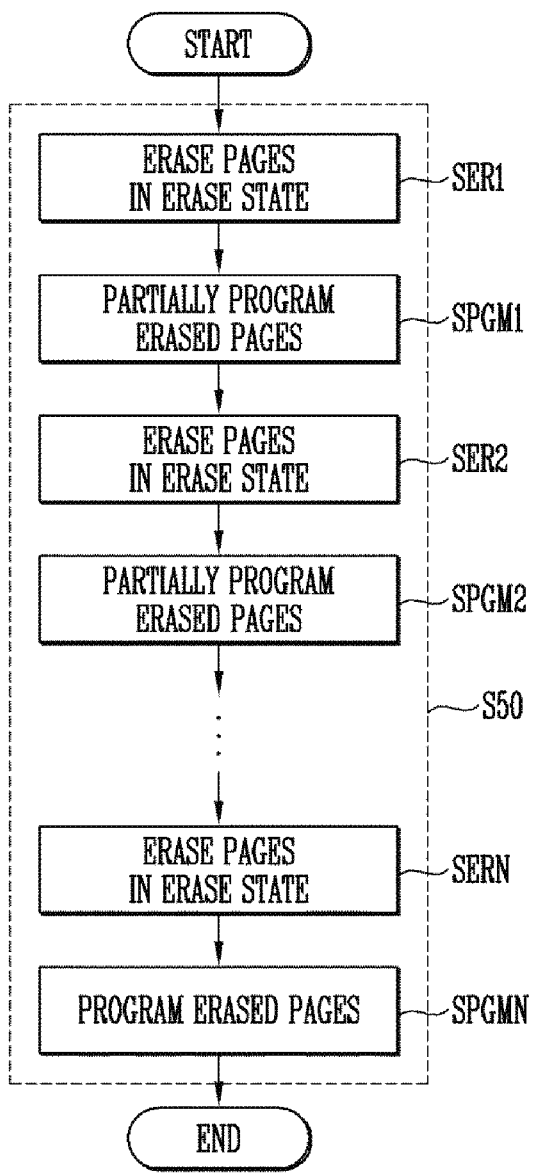
FIG. 11 is a flowchart illustrating a program operation according to an embodiment of the present disclosure.

FIG. 11 is a flowchart illustrating a program operation according to an embodiment of the present disclosure.

In the program operation of FIG. 11, the steps 'S41' to 'S44' discussed above may be performed as well, but a disturbance compensation operation of FIG. 11 may be different from the disturbance compensation operation discussed above (S50).

In the disturbance compensation operation according to an embodiment, a partial erase operation and a partial program operation of erased pages may be performed on a page group basis. For example, if the first program operation (PGM1 of FIG. 10) is performed on pages up to the set page and is completed, a first partial erase operation SER1 may be performed on all or some of the other non-programmed pages (pages in the erase state). The first partial erase operation SER1 may be performed on all of the other pages on which the first program operation PGM1 has not been performed.

If the first partial erase operation SER1 is completed, a first partial program operation SPGM1 may be performed on some pages among the pages on which the first partial erase operation SER1 has been performed. The first partial program operation SPGM1 is not performed on all of the pages on which the first partial erase operation SER1 has been performed. Instead, the first partial program operation SPGM1 may be performed up to another set page.

If the first partial program operation SPGM1 is completed up to the another set page, a second partial erase operation SER2 may be performed on all or some of the other non-programmed pages. The second partial erase operation SER2 may be performed on all of the other pages on which the first partial program operation SPGM1 has not been performed. That is, while the first partial program operation SPGM1 is being performed, a program disturbance may occur in some pages. Therefore, the second partial erase operation SER2 is performed, so that threshold voltages of non-programmed memory cells may be initialized to the erase state.

If the second partial erase operation SER2 is completed, a second partial program operation SPGM2 may be performed on some pages among the pages on which the second partial erase operation SER has been performed. The second partial program operation SPGM2 is not performed on all of the pages on which the second partial erase operation SER2 has been performed. The second partial program operation SPGM2 may be performed up to another set page.

In this manner, an Nth partial erase operation SERN and an Nth partial program operation SPGMN may be performed on the other pages.

Figure 12:
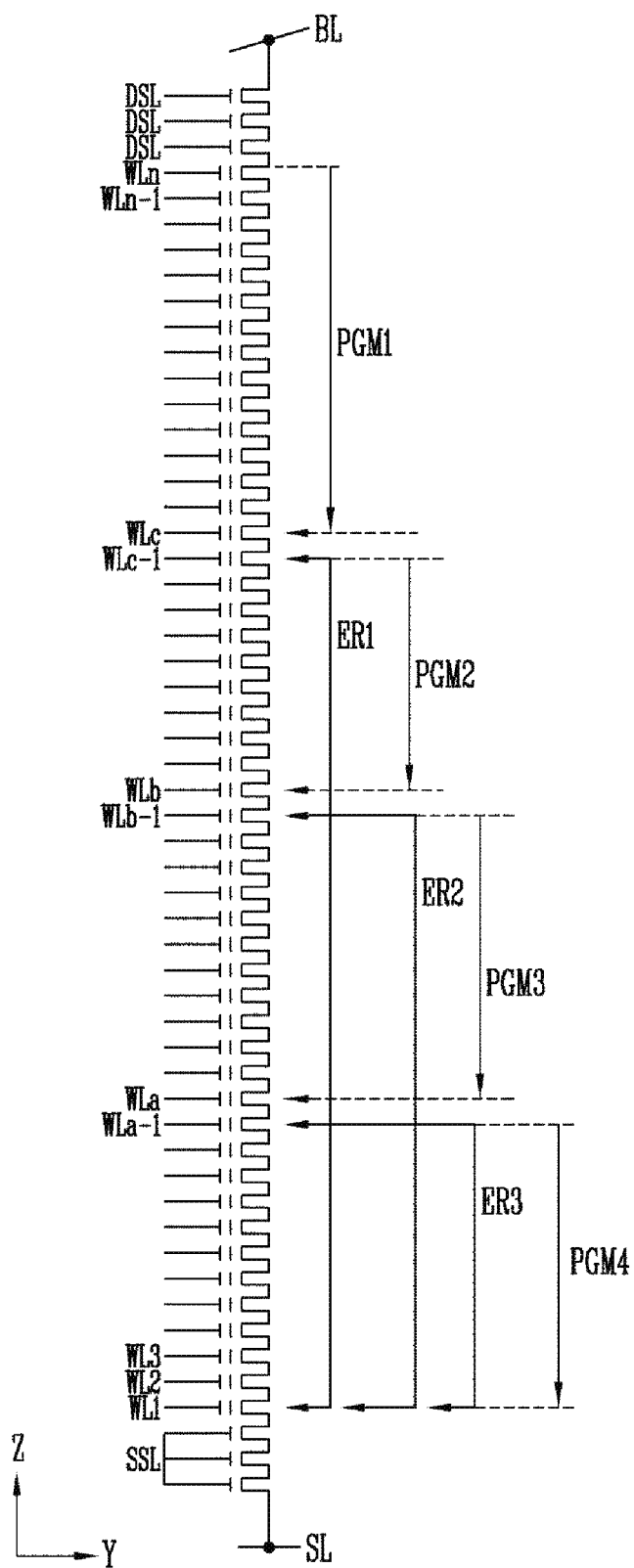
FIG. 12 is a diagram illustrating in detail the program operation according to an embodiment of the present disclosure.

FIG. 12 is a diagram illustrating in detail the program operation according to an embodiment of the present disclosure. Here, it is assumed that the cell strings are I-shaped cell strings illustrated in FIG. 8.

Referring to FIG. 12, the program operation may be sequentially performed in an order from an nth page coupled to an nth word line WLn to a first page coupled to a first word line WL. Here, the nth word line WLn may be a word line located at the uppermost end among the word lines of FIG. 8, and the first word line WL1 may be a word line located at the lowermost end among the word lines of FIG. 8.

In a test program operation of the memory device, although it is determined that a program disturbance frequently occurs in first to (a−1)th pages respectively coupled to first to (a−1)th word lines WL1 to WLa−1 (a is a positive integer, and a<n), the program disturbance may still occur in some of the other pages. Therefore, in an embodiment, the pages may be divided into several groups, and a program operation and a partial erase operation may be performed for each group.

For example, a cth page coupled to a cth word line WLc adjacent to an upper portion of a (c−1)th word line WLc−1 (c is a positive integer, and a<c<n) may be a first set page. The program operation may be sequentially performed in an order from the nth page coupled to the nth word line WLn to the cth page coupled to the cth word line WLc. It is assumed that the program operation performed on the nth to cth pages is a first partial program operation PGM1.

If the first partial program operation PGM1 is completed, a first partial erase operation ER1 is performed on the (c−1)th to first pages respectively coupled to the other (c−1)th to first word lines WLc−1 to WL1 on which the program operation has not been performed. That is, a partial erase operation is performed on non-programmed pages (pages in an erase state).

If the first partial erase operation ER1 of the (c−1)th to first pages is completed, a second partial program operation PGM2 may be sequentially performed on the (c−1)th to b pages respectively coupled to the (c−1)th to b word lines WLc−1 to WLb (b is a positive integer, and a<b<c), among the pages on which the first partial erase operation ER1 has been performed.

If the second partial program operation PGM2 is completed up to the b page, a second partial erase operation ER2 is performed on the (b−1)th to first pages respectively coupled to the (b−1)th to first word lines WLb−1 to WL1 on which the program operation has not been performed.

If the second partial erase operation ER2 of the (b−1)th to first pages is completed, a third partial program operation PGM3 is sequentially performed on the (b−1)th to ath pages respectively coupled to the (b−1)th to ath word lines WLb−1 to WLa, among the pages on which the second partial erase operation ER2 has been performed.

The third partial program operation PGM3 is completed up to the ath page, a third partial erase operation ER3 is performed on the (a−1)th to first pages respectively coupled to the other (a−1)th to first word lines WLa−1 to WL1 on which the program operation has not been performed.

If the third partial erase operation ER3 of the (a−1)th to first pages is completed, a third partial program operation PGM4 is performed on the (a−1)th to the first pages on which the third partial erase operation ER3 has been performed.

Although only four partial program operations PGM1 to PGM4 and three partial erase operations ER1 to ER3 have been illustrated in FIG. 12 for convenience, it should be understood that the present disclosure is not limited thereto. Therefore, partial program operations and partial erase operations may be further performed based on the number of set pages.

Figure 13:
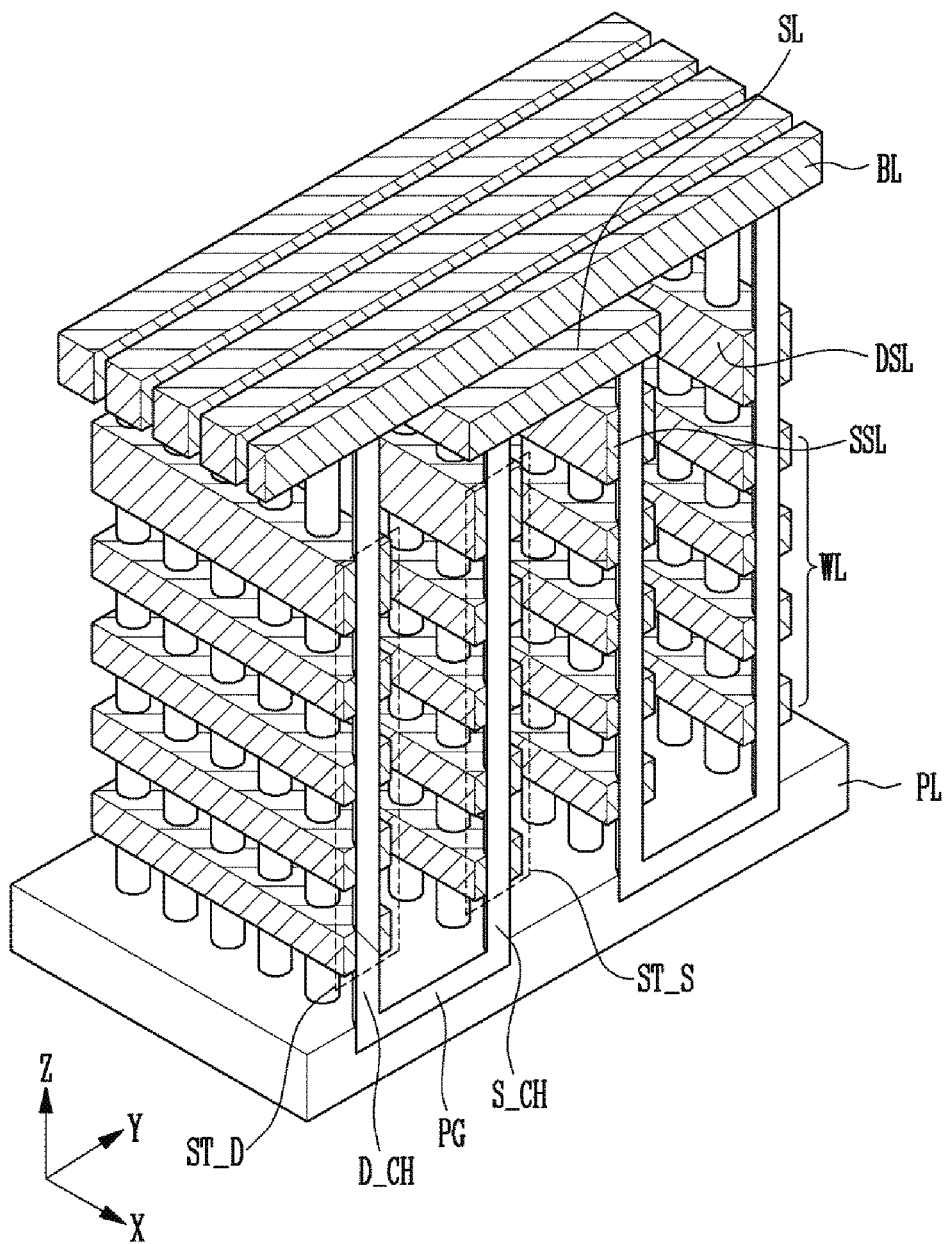
FIG. 13 is a perspective view illustrating an example of the memory block having the three-dimensional structure.

FIG. 13 is a perspective view illustrating an example of the memory block implemented in the three-dimensional structure.

Referring to FIG. 13, the memory block implemented in the three-dimensional structure. For example, a memory block with U-shaped cell strings may be formed in a Z direction over a substrate, and may include source strings ST_S and drain strings ST_D, which are coupled between bit lines BL and a source line SL. The source strings ST_S and the drain strings ST_D may be coupled to each other through pipe channel layers P_CH, to be formed in a U shape. The pipe channel layers P_CH may be formed in a pipe line PL. More specifically, the source strings ST_S may be vertically arranged between the source line SL and the pipe line PL, and the drain strings ST_D may be vertically arranged between the bit lines BL and the pipe line PL. Examples of the U-shaped structure may include a "pipe-shaped bit cost scalable (P-BiCS)" structure.

The drain strings ST_D may include word lines WL and a drain select lines DSL, which are arranged in a first direction (e.g., Y direction) and spaced apart from each other, and drain vertical channel layers D_CH vertically penetrating the word lines WL and the drain select line DSL. The source strings ST_S may include word lines WL and a source select line SSL, which are arranged in the first direction (e.g., Y direction) and spaced apart from each other, and source vertical channel layers S_CH vertically penetrating the word lines WL and the source select line SSL. The drain vertical channel layer D_CH and the source vertical channel layer S_CH may be coupled to each other by the pipe channel layers P_CH in the pipe line PL. The bit lines BL may be arranged in a second direction (e.g., X direction) perpendicular to the first direction (e.g., Y direction) while contacting the tops of the drain vertical channel layers D_CH protruding upwardly from the drain select line DSL.

A program operation of the three-dimensional memory device described in FIG. 13 will be described as follows.

Figure 14:
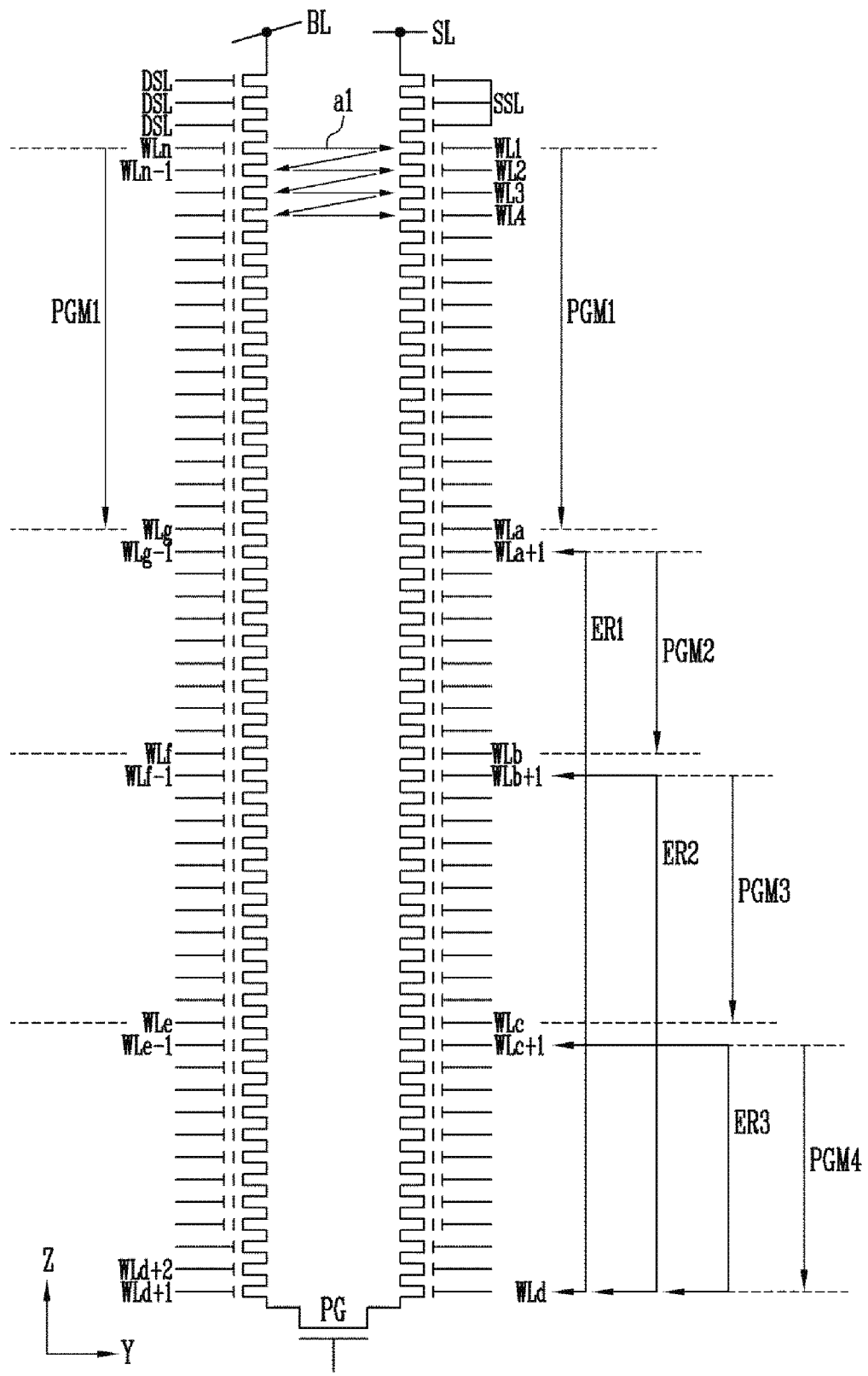
FIG. 14 is a diagram illustrating an example of a program operation according to an embodiment of the present disclosure.

FIG. 14 is a diagram illustrating an example of a program operation according to an embodiment of the present disclosure. Here, the program operation of the U-shaped string illustrated in FIG. 13 will be discussed.

Referring to FIG. 14, the program operation according to an embodiment may be sequentially performed in an order from a page located at the uppermost end to a page located at the lowermost end. For example, in the U-shaped string, it may be assumed that the word line located at the uppermost end among the word lines coupled to the source string (ST_S of FIG. 13) is a first word line WL1, and it may be assumed that the word line located at the lowermost end among the word lines coupled to the source string (ST_S of FIG. 13) is a dth word line WLd. Also, it may be assumed that the word line located at the uppermost end among the word lines coupled to the drain string (ST_D of FIG. 13) is an nth word line WLn, and it may be assumed that the word line located at the lowermost end among the word lines coupled to the drain string (ST_D of FIG. 13) is a (d+1)th word line WLd+1 (d and n are positive integers, and 1<d<n).

When the program operation is performed in an order from pages located at the uppermost end, the program operation may be started from an nth page coupled to the nth word line WLn or a first page coupled to the first word line WL1. When assuming that the program operation is started from the nth page, if the program operation of the nth page is completed, the program operation of the first page located in the same layer as the nth page may be performed. If the program operation of the first page is completed, the program operation of an (n−1)th page coupled to an (n−1)th word line WLn−1 located at a lower end of the nth word line WLn may be performed. If the program operation of the (n−1)th page is completed, the program operation of a second page located in the same layer as the (n−1)th page, the second page being coupled to a second word line WL2 located at a lower end of the first word line WL1, may be performed. In this manner, the program operation may be sequentially performed in an order from pages located at the uppermost ends of the source string ST_S and the drain string ST_D to pages located at a lower position.

If it is assumed that a first program operation performed in an order of the nth page, the first page, the (n−1)th page, and the second page is a first partial program operation PGM1, the first partial program operation PGM1 may be performed up to gth and ath pages respectively coupled to gth and ath word lines WLg and WLa (g and a are positive integers, and a<g) located in the same layer. Here, the gth and ath pages may be set pages.

If the first partial program operation PGM1 is completed, a first partial erase operation ER1 is simultaneously performed on the other (g−1)th to (d+1)th pages respectively coupled to the (g−1)th to (d+1)th word lines WLg−1 to WLd+1, on which the program operation has not been performed, and the other (a+1)th to dth pages respectively coupled to the (a+1)th to dth word lines WLa+1 to WLd, on which the program operation has not been performed.

If the first partial erase operation ER1 is completed, a second partial program operation PGM2 is sequentially performed on (g−1)th to fth pages respectively coupled to (g−1)th to fth word lines WLg−1 to WLf (f is a positive integer, and a<f<g) and (a+1)th to bth pages respectively coupled to (a+1)th to bth word lines WLa+1 to WLb (b is a positive integer, and a<b<g), among the pages on which the first partial erase operation ER1 has been performed. Like the first partial program operation PGM1, the second partial program operation PGM2 may be sequentially performed in an order from pages located at an upper position to pages located at a lower position.

If the second partial program operation PGM2 is completed, a second partial erase operation ER2 is performed on the other (f−1)th to (d+1)th pages respectively coupled to the (f−1)th to (d+1)th word lines WLf−1 to WLd+1, on which the program operation has not been performed, and the other (b+1)th to dth pages respectively coupled to the (b+1) to dth word lines WLb+1 to WLd, on which the program operation has not been performed.

If the second partial erase operation ER2 is completed, a third partial program operation PGM3 is sequentially performed on (f−1)th to eth pages respectively coupled to (f−1)th to eth word lines WLf−1 to WLe (e is a positive integer, and d<e<f) and (b+1)th to cth pages respectively coupled to (b+1)th to cth word lines WLb+1 to WLc (c is a positive integer, and b<c<d), among the pages on which the second partial erase operation ER2 has been performed. Like the first partial program operation PGM1, the third partial program operation PGM3 may be sequentially performed in an order from pages located at an upper position to pages located at a lower position.

If the third partial program operation PGM3 is completed, a third partial erase operation ER3 may be performed on the other (e−1)th to (d+1)th pages respectively coupled to the (e−1)th to (d+1)th word lines WLe−1 to WLd+1, on which the program operation has not been performed, and the (c+1)th to dth pages respectively coupled to the (c+1)th to dth word lines WLc+1 to WLd, on which the program operation has not been performed.

If the third partial erase operation ER3 is completed, a fourth partial program operation PGM4 is sequentially performed on the (e−1)th to (d+1)th pages and the (c+1)th to dth pages, on which the third partial erase operation ER3 has been performed. Like the first partial program operation PGM1, the fourth partial program operation PGM4 may be sequentially performed in an order from pages located at an upper position to pages located at a lower position.

Although only four partial program operations PGM1 to PGM4 and three partial erase operations ER1 to ER3 have been illustrated in FIG. 14 for convenience, it should be understood that the present disclosure is not limited thereto. Therefore, partial program operations and partial erase operations may be further performed based on the number of set pages.

Figure 15:
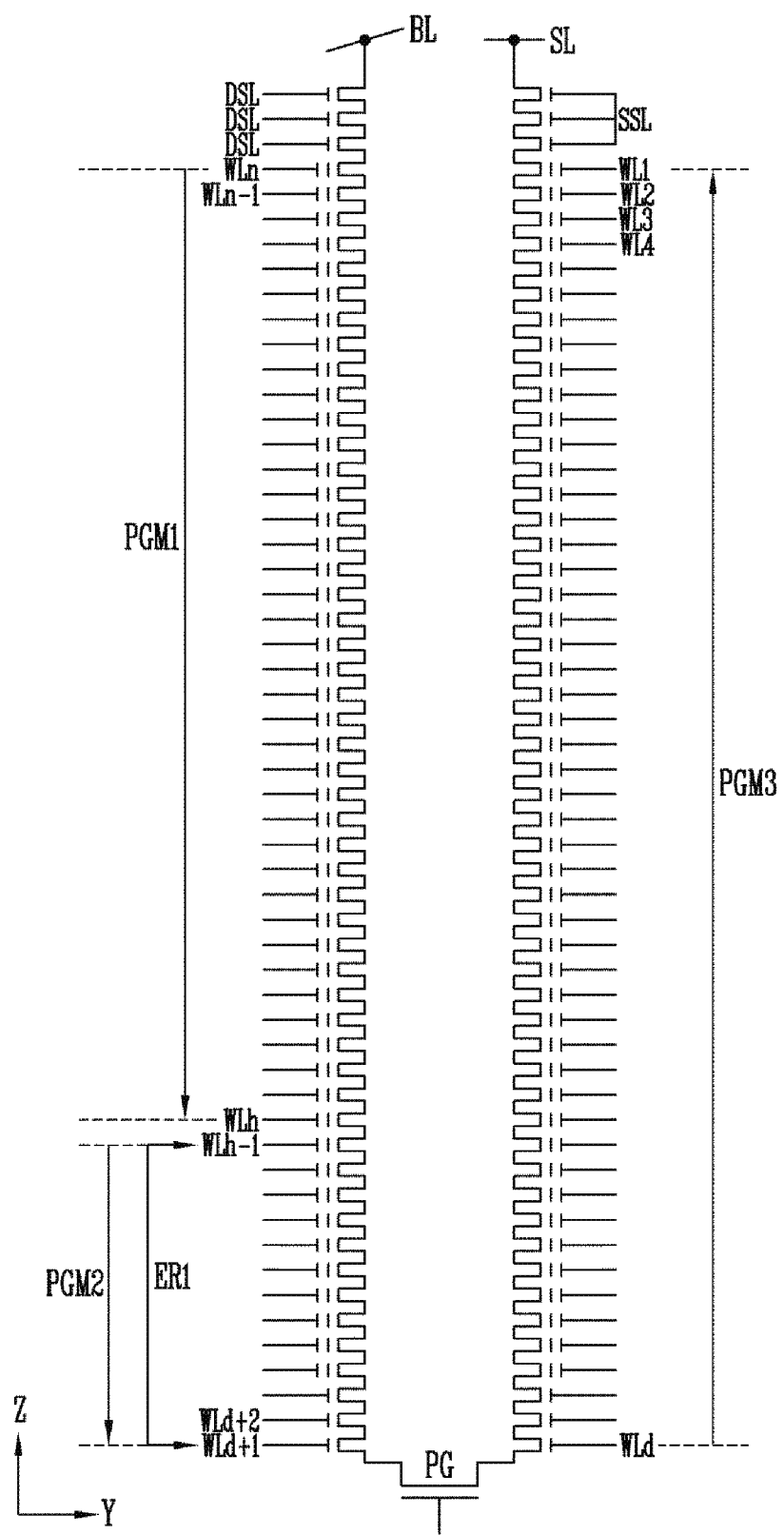
FIG. 15 is a diagram illustrating an example of a program operation according to an embodiment of the present disclosure.

FIG. 15 is a diagram illustrating an example of a program operation according to an embodiment of the present disclosure. Here, the program operation of the U-shaped string illustrated in FIG. 13 will be discussed.

Referring to FIG. 15, the program operation according to an embodiment may be sequentially performed in an order from a page located at the uppermost end of the source string (ST_S of FIG. 13) or the drain string (ST_D of FIG. 13) to a page located at a lower position. For example, in the U-shaped string, it may be assumed that the word line located at the uppermost end among the word lines coupled to the source string (ST_S of FIG. 13) is a first word line WL1, and it may be assumed that the word line at the lowermost end among the word lines coupled to the source string (ST_S of FIG. 13) is a dth word line WLd. Also, it may be assumed that the word line located at the uppermost end among the word lines coupled to the drain string (ST_D of FIG. 13) is an nth word line WLn, and it may be assumed that the word line at the lowermost end among the word lines coupled to the drain string (ST_D of FIG. 13) is a (d+1)th word line WLd+1 (d and n are positive integers, and 1<d<n).

If it is assumed that the program operation is started from an nth page coupled to the nth word line WLn located at the uppermost end of the drain string ST_D, after the program operation of the nth page is completed, the program operation may be performed on an (n−1)th page adjacent to a lower end of the nth page and coupled to an (n−1)th word line.

If it is assumed that a first program operation performed from the nth page is a first partial program operation PGM1, the first partial program operation PGM1 may be sequentially performed in an order from first to hth pages respectively coupled nth to hth word lines WLn to WLh (h is a positive integer, and d<h<n). Here, the hth page may be an arbitrarily set page.

If the first partial program operation PGM1 is completed, a first partial erase operation ER1 may be performed on pages included in the drain string ST_D, on which the first partial program operation PGM1 has been performed, among the pages on which the program operation has not been performed. For example, the first partial erase operation ER1 may be performed on (h−1)th to (d+1)th pages respectively coupled to (h−1)th to (d+1)th word lines WLh−1 to WLd+1. In an embodiment, the program operation of the source string ST_S may be performed in an order from the lower end to the upper end, and thus a partial erase operation for pages in the source string ST_S may be omitted, thereby reducing an operation time.

If the first partial erase operation ER1 is completed, a second partial program operation PGM2 may be sequentially performed on the (h−1)th to (d+1)th pages on which the first partial erase operation ER1 has been performed.

If the second partial program operation PGM2 is completed, a third partial program operation may be sequentially performed on dth to first pages respectively coupled to dth to first word lines WLd to WL1 of the source string ST_S. That is, if the second partial program operation PGM2 is completed, the third partial program operation PGM3 may be continuously performed.

In an embodiment, addresses of a plurality of pages among pages of one of the drain and source strings ST_D and ST_S, on which the program operation is first performed, may be previously set and stored, and partial program operations and partial erase operations can be performed using the stored addresses as set addresses.

Figure 16:
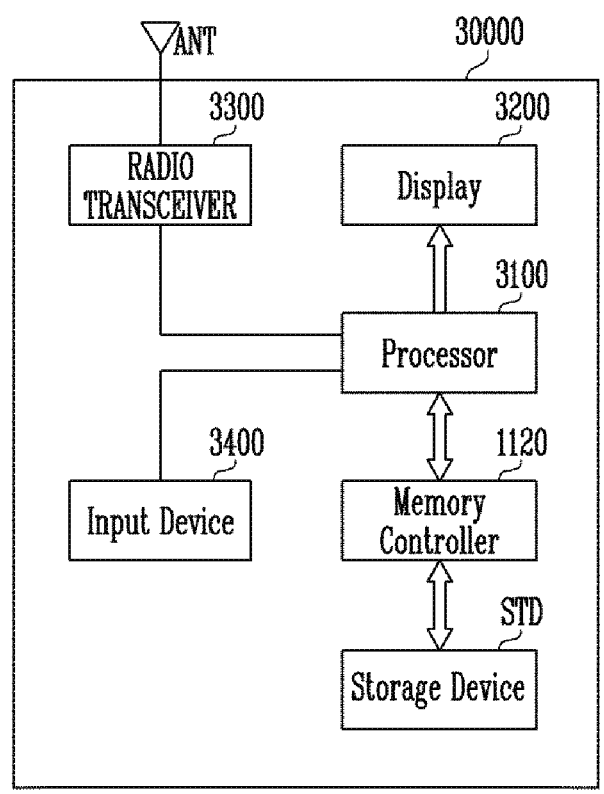
FIG. 16 is a diagram illustrating another embodiment of the memory system including the memory controller and storage device shown in FIG. 1.

FIG. 16 is a diagram illustrating another embodiment of the memory system including the memory controller and storage device shown in FIG. 1.

Referring to FIG. 16, the memory system 30000 may be implemented as a cellular phone, a smart phone, a tablet PC, a personal digital assistant (PDA), or a wireless communication device. The memory system 30000 may include a storage group STG and a memory controller 1120 capable of controlling an operation of the storage group STG. The memory controller 1120 may control a data access operation of the storage group STG, e.g., a program operation, an erase operation, a read operation, or the like under the control of a processor 3100.

Data programmed in the storage group STG may be output through a display 3200 under the control of the memory controller 1120.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1120 or the display 3200. The memory controller 1120 may transmit the signal processed by the processor 3100 to the storage group STG. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1120, data output from the radio transceiver 3300, or data output from the input device 3400 can be output through the display 3200.

In some embodiments, the memory controller 1120 capable of controlling an operation of the storage group STG may be implemented as a part of the processor 3100, or be implemented as a chip separate from the processor 3100.

Figure 17:
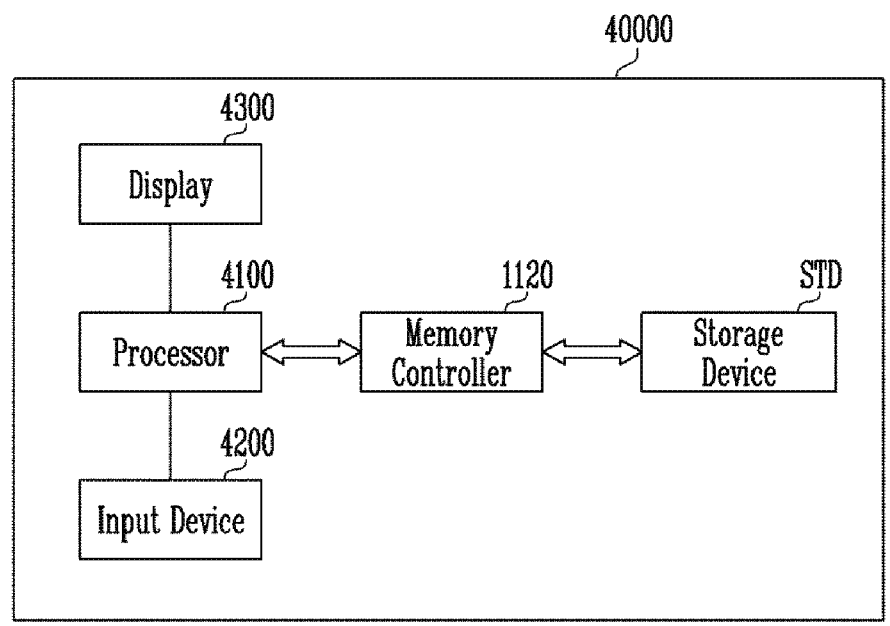
FIG. 17 is a diagram illustrating another embodiment of the memory system including the memory controller s and storage device shown in FIG. 1.

FIG. 17 is a diagram illustrating another embodiment of the memory system including the memory controller s and storage device shown in FIG. 1.

Referring to FIG. 17, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a storage group STG and a memory controller 1120 capable of controlling a data processing operation of the storage group STG.

A processor 4100 may output data stored in the storage group STG through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1120. In some embodiments, the memory controller 1120 capable of controlling an operation of the storage group STG may be implemented as a part of the processor 4100, or be implemented as a chip separate from the processor 4100.

Figure 18:
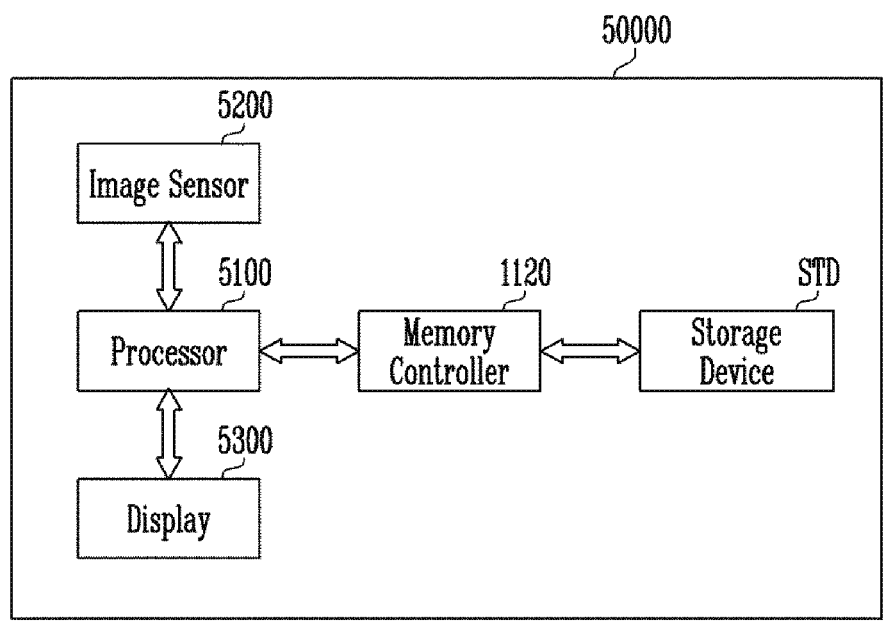
FIG. 18 is a diagram illustrating another embodiment of the memory system including the memory controller and storage device shown in FIG. 1.

FIG. 18 is a diagram illustrating another embodiment of the memory system including the memory controller and storage device shown in FIG. 1.

Referring to FIG. 18, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a storage group STG and a memory controller 1120 capable of controlling a data processing operation of the storage group STG, e.g., a program operation, an erase operation, or a read operation.

An image sensor 5200 of the memory system 50000 may convert an optical image into digital signals, and the converted digital signals may be transmitted to a processor 5100 or the memory controller 1120. Under the control of the processor 5100, the converted digital signals may be output through a display 5300, or be stored in the storage group STG through the memory controller 1120. In addition, data stored in the storage group STG may be output through the display 5300 under the control of the processor 5100 or the memory controller 1120.

In some embodiments, the memory controller 1200 capable of controlling an operation of the storage group STG may be implemented as a part of the processor 5100, or be implemented as a chip separate from the processor 5100.

Figure 19:
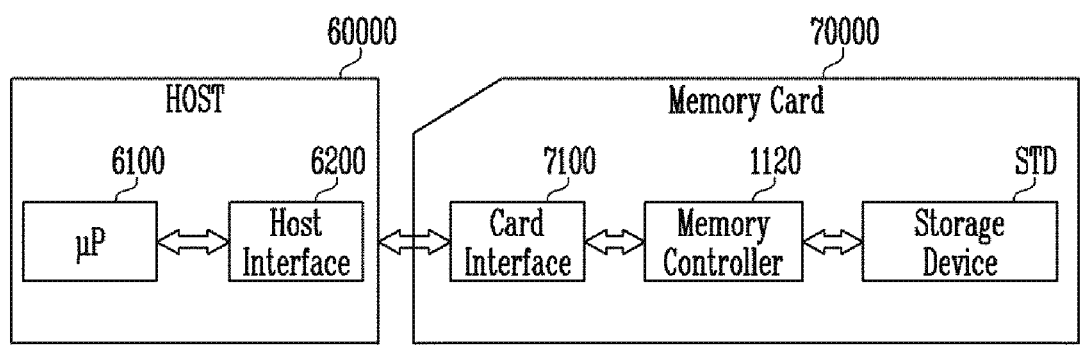
FIG. 19 is a diagram illustrating another embodiment of the memory system including the memory controller and storage device shown in FIG. 1.

FIG. 19 is a diagram illustrating another embodiment of the memory system including the memory controller and storage device shown in FIG. 1.

Referring to FIG. 19, the memory system 70000 may be implemented as a memory card or a smart card. The memory system 70000 may include a storage group STG, a memory controller 1120, and a card interface 7100.

The memory controller 1120 may control data exchange between the storage group STG and the card interface 7100.

In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1120 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the storage group STG through the card interface 7100 and the memory controller 1120 under the control of a microprocessor (μP) 6100.

According to an embodiment of the present disclosure, it is possible to improve the reliability of a program operation of the memory device.

What is claimed is:

1. A method for operating a memory system, the method comprising:
    performing a test program operation of dies;
    storing addresses of the dies, in a low status die table, having a program disturbance greater than a reference value in response to a result of the test program operation;
    determining whether a die address of a die including a selected memory block is stored in the low status die table in a first program operation;
    outputting a normal program command to a selected die for sequentially programming pages up to a last page of the selected memory block when a selected address for the first program operation is not included in the low status die table;
    outputting a partial program command to the selected die for sequentially programming pages up to a set page of the selected memory block and a partial erase command to the selected die for erasing pages in an erase state, when the die address of the die including the selected memory block is included in the low status die table;
    programming a first closest memory cell from a bit line in the selected die;
    programming a first closest memory cell from a source line after the first closest memory cell from the bit line is programmed;
    programming a second memory cell from the bit line after the first closest memory cell from the source line is programmed;
    programming a second memory cell from the source line after the second memory cell from the bit line is programmed;
    programming an $N^{th}$ memory cell from the bit line after the second memory cell from the source line is programmed, wherein the $N^{th}$ memory cell from the bit line is included in the set page;
    programming an $N^{th}$ memory cell from the source line after the $N^{th}$ memory cell from the bit line is programmed, wherein the $N^{th}$ memory cell from the source line is included in the set page;

erasing memory cells coupled between the $N^{th}$ memory cell from the source line and the Nth memory cell from the bit line; and programming the erased memory cells.

2. The method of claim 1, wherein, in response to the partial program command and the partial erase command, each of the dies:

sequentially programs pages included between a bit line and the set page;

erases pages included between the set page and a source select line; and sequentially program pages included between the set page and the source select line.

3. The method of claim 2, wherein the set page is set as a page in which program disturb starts increasing.

* * * * *